(12) United States Patent
Gwo et al.

(10) Patent No.: US 6,274,513 B1
(45) Date of Patent: Aug. 14, 2001

(54) METHOD OF OXIDIZING A NITRIDE FILM ON A CONDUCTIVE SUBSTRATE

(76) Inventors: Shangjr Gwo, 6F-1, No. 1, Lane 175, Wu-Ling Rd., Lin 10, Nan-Chung Li, Hsinchu; Ya-Chang Chou, No. 44, Lane 147, Pao-Hsin Rd., Lin 5, Shuang-His Tsun, Pao-Shan Hsiang, Hsinchu Hsien; Tom Chen, No. 50, Sec. 2, Kuang-Fu Rd., Lin 7, Kuang-Ming Li; Tien-Sheng Chao, 4F, No. 5, Lane 72, Yuan-Hou St., both of Hsinchu, all of (TW)

( * ) Notice: Subject to any disclaimer, the term of this patent is extended or adjusted under 35 U.S.C. 154(b) by 0 days.

(21) Appl. No.: 09/644,884

(22) Filed: Aug. 23, 2000

(30) Foreign Application Priority Data

Dec. 1, 1999 (TW) ................................. 88120972

(51) Int. Cl.⁷ .......................... H01L 21/31; H01L 21/469
(52) U.S. Cl. .......................... 438/771; 438/769; 438/770; 438/772
(58) Field of Search .................... 438/771, 769, 438/770, 772

(56) References Cited

U.S. PATENT DOCUMENTS 6,000,947 * 12/1999 Minne et al. ...................... 437/228
6,001,748 * 12/1999 Tanaka et al. ..................... 438/791
6,114,258 * 9/2000 Miner et al. ....................... 438/787
6,190,508 * 2/2001 Peng et al. ...................... 204/157.46

* cited by examiner

Primary Examiner—John F. Niebling
Assistant Examiner—Alexander G. Ghyka
(74) Attorney, Agent, or Firm—Darby & Darby

(57) ABSTRACT

The present invention discloses a method of oxidizing a nitride film on a conductive substrate comprising the following steps. First, a conductive substrate is provided, and a nitride film is formed on the main surface of the conductive substrate by performing film deposition process or directly nitridating the surface region of the conductive substrate. Then, a local electrode terminal (such as a conductive probe of a scanning-probe microscope) is provided, and a strong electric field is locally generated between the electrode terminal and the conductive substrate in an oxidizing environment, wherein the strong electric field passes through the nitride film, thereby oxidizing the nitride film region passed by the electric field. The method of oxidizing a nitride film according to the present invention can be applied to define patterns on a nitride film, to record information as memory media, and to form growth templates for the use in chemical selective formation processes.

45 Claims, 6 Drawing Sheets

METHOD OF OXIDIZING A NITRIDE FILM ON A CONDUCTIVE SUBSTRATE

BACKGROUND OF THE INVENTION

1. Field of the Invention

The present invention relates to a method of oxidizing a nitride film on a conductive substrate. The method utilizes electric field to pass through and oxidize the nitride film, and it has wide applications because of its fast reacting speed and simple steps of operation.

2. Description of the Related Art

Silicon dioxide ($SiO_2$) and silicon nitride ($Si_3N_4$) are two essential materials for fabrication of semiconductor devices. The isolation property of the Si—$SiO_2$ interface is better than that of the Si—$Si_3N_4$ interface, and therefore $SiO_2$ layers generally serve as isolation materials in the conventional process of micrometer scale.

To achieve high integration density and improve operation speed, the ultra-large-scale integrated circuits tend to scale down into the nanometer regime. In the nanometer process, the required thickness of an isolation layer is about 2~3 nm. Tunneling effects will occur in the isolation layer made of $SiO_2$ under such thickness demand, and therefore the $SiO_2$ layer is no longer a good material for isolation. On the contrary, the $Si_3N_4$ films and $SiO_xN_y$ films may become the essential materials for isolation in the nanometer process.

In addition, a series of photolithography steps and etching steps can carry out according to several defined patterns in fabricating semiconductor devices. During etching process, each of $SiO_2$, $Si_3N_4$, $SiO_xN_y$, or Si has different etching selectivity corresponding to the etching solvent; therefore they can be selected to serve as masks or etching targets. It is noted that forming oxidized regions in a nitride film is advantageous to define etching patterns in fabricating semiconductor devices.

At present, the scanning probe microscope such as atomic force microscope (AFM) and scanning tunneling microscope (STM) can generate a local electric field adjacent to its probe to carry out oxidizing process. However, its application is restricted to oxidize the surface regions of the semiconductors and metals, not yet applied for oxidizing the nitride films formed on a conductive substrate.

SUMMARY OF THE INVENTION

Therefore, an object of the present invention is to provide a method of oxidizing a nitride film on a conductive substrate. The method comprises the following steps. First, a conductive substrate is provided, and a nitride film is formed on the main surface of the conductive substrate by performing film deposition process or directly nitridating the surface region of the conductive substrate. Then, a local electrode terminal (such as a conductive probe of the AFM) is provided, and a strong electric field is locally generated between the electrode terminal and the conductive substrate in an oxidizing environment (such as the absorbed water layer in ambient), wherein the strong electric field passes through the nitride film, thereby oxidizing the nitride film passed by the electric field.

The method of oxidizing a nitride film according to, the present invention can be applied to define etching patterns on a nitride film. In addition, the method can be applied to memory media for information recording, ascribing to the fast oxidation speed. Meanwhile, the method can be applied to form growth templates for the use in the chemical selective formation process, because the nitride films and the. surface of the conductive substrate have different growth properties.

BRIEF DESCRIPTION OF THE DRAWINGS

The following detailed description, given by way of the examples and not intended to limit the invention solely to the embodiments described herein, will best be understood in conjunction with the accompanying drawings, in which.

DETAILED DESCRIPTION OF THE PREFERRED EMBODIMENTS

Figure 1A:
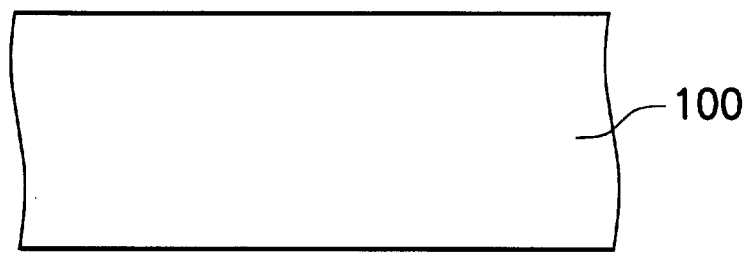
FIGS. 1A to 1C show, in cross sectional view, the process of the embodiment of the present invention for oxidizing a nitride film.
Figure 1B:
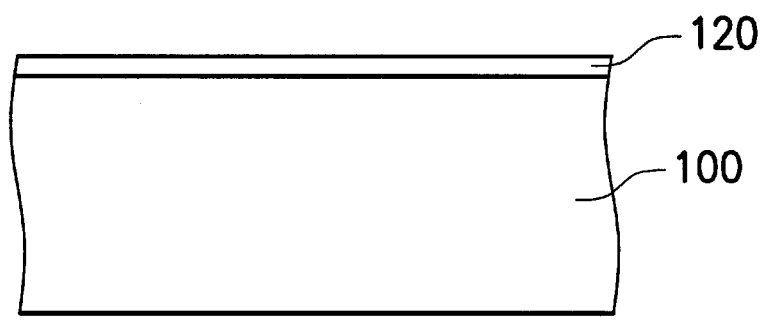
Figure 1C:
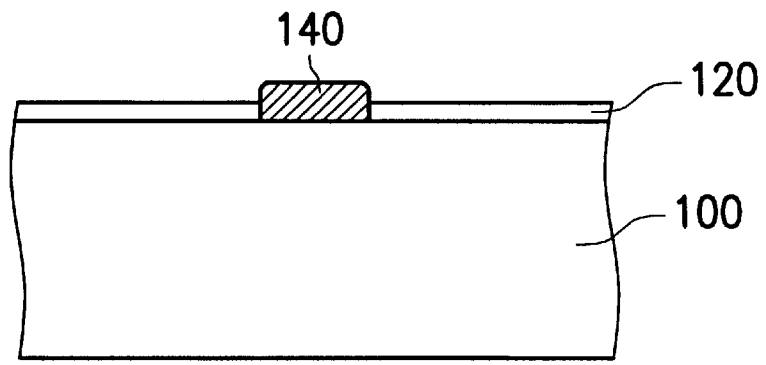

FIGS. 1A to 1C show, in cross sectional view, the process of the embodiment of the present invention for oxidizing a nitride film.

First, as shown in FIG. 1A, a p-type silicon substrate 100 with the resistivity of 10 Ω-cm and lattice direction [001] normal to the substrate.

Then, a nitride film 120, with thickness of about 5 nm, is formed on the main surface of the silicon substrate 100, as shown in FIG. 1B. In this embodiment, the mixture of $SiCl_2H_2$ and $NH_3$ gases is used for carrying out low-pressure chemical vapor deposition (LPCVD) process at the temperature of 780° C., thereby forming the nitride film 120 on the main surface of the silicon substrate 100. In addition, the nitride film 120 is exposed to the nitrogen gas, and subjected to rapid thermal anneal process at the temperature of 1000° C. for 10 seconds, thereby making the nitride film 120 more compact and reducing its thickness to 4.2 nm.

In the atmosphere, the surface of the sample (the nitride film 120 and the silicon substrate 100) often adheres a thin water film. At this time, an AFM in the contact operation mode and its probe made up of n-type heavily doped silicon or n-type heavily doped silicon gilt by metal are used to generate a strong electric field between the silicon substrate 100 and the probe (not shown in FIG. 2), wherein the electric field passes through the nitride film 120. The electric field dissociates the oxidant ions in the water film and induces oxidizing reaction in the nitride film 120, in the way of anodizing the sample. Therefore, a convex oxidized portion 140 is formed in the nitride film 120.

Figure 2:
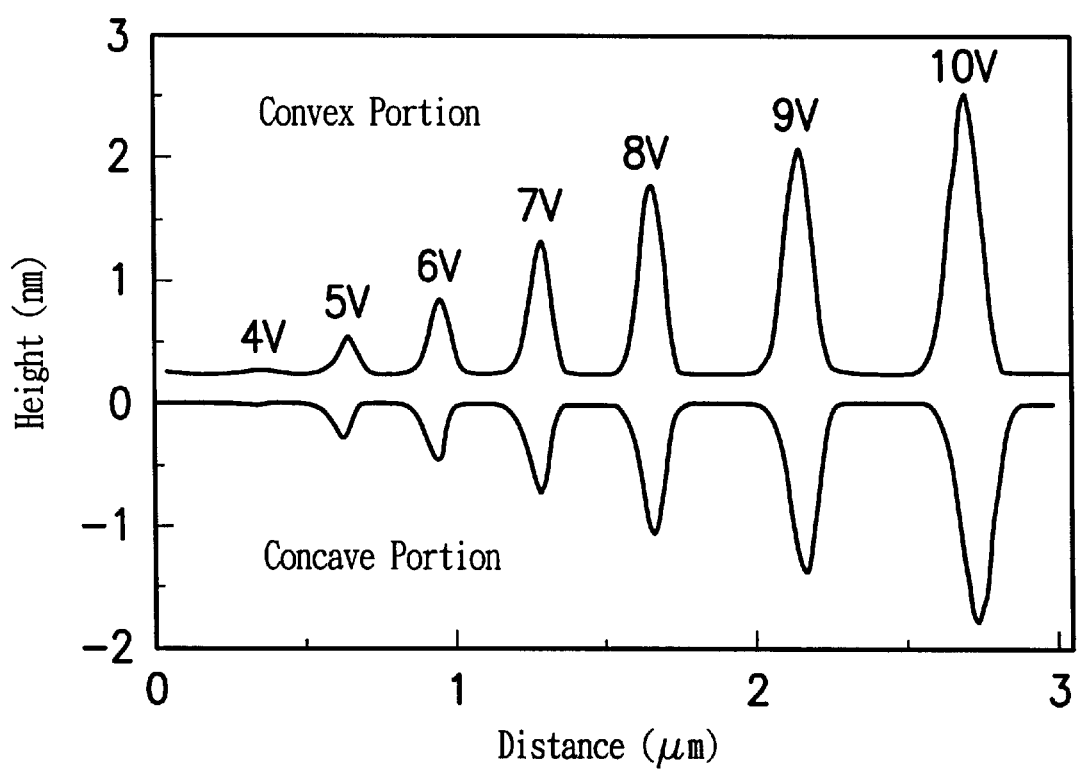
FIG. 2 shows the lateral view of the oxidized regions in the nitride films.

FIG. 2 shows the oxidation patterns generated by using the probe on the sample by grounding the sample and biasing different positive voltage to the probe, under the conditions described above. The contact force of the probe to the sample is 0.4 nN and the scanning rate of the probe is 0.1 μm/s.

In addition, the oxidizing process is carried out by applying different bias voltages (+4V~+10V) to the probe in conjunction with different oxidization times (1 ms~500 ms). According to the experiment results, the relation between the growth rate of oxidization (dh/dt) and the grown oxide thickness (h) conform the following expression:

$$dh/dt \; exp^{(-h/Lc)};$$

wherein $L_c$ represents "characteristic decay length". The length of $L_c$ generally is between about 0.3~0.6 nm. In this way of oxidization (AFM-induced oxidation of $Si_3N_4$), the initial growth rate is greater than $10^3$ nm/sec at 10V. compared with the rate coefficient A=1 $nm/min^{2/3}$ (oxide thickness: $h=A \times t^{2/3}$) of the wet thermal oxidization performed at 1100° C. and under 0.95 atm of water vapor, the AFM-induced oxidation of the nitride film is much faster.

The method described above can be applied to define etching patterns. FIGS. 3A to 3E and 3E' show, in cross sectional view, the process of one embodiment of the present invention for etching the nitride film. For brevity, the same elements or devices in FIGS. 3A~3D and FIGS. 2A~2C are represented in the same notations or numerals.

Figure 3A:
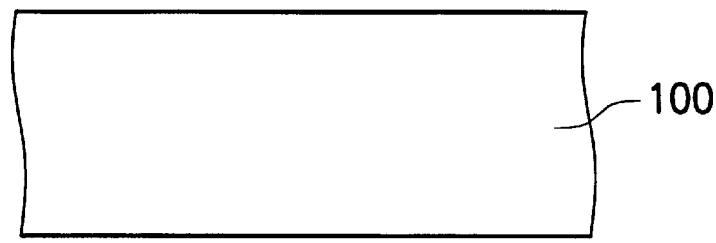
FIGS. 3A to 3E and 3E' show, in cross sectional view, the process of one embodiment of the present invention for etching the nitride film.
Figure 3B:
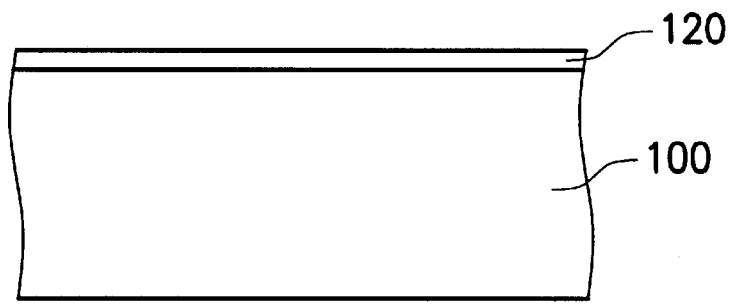
Figure 3C:
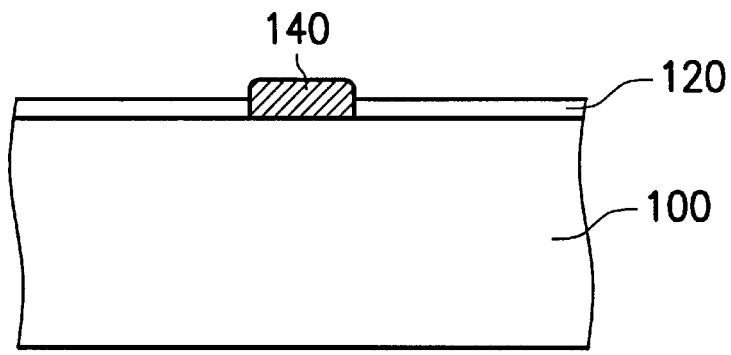

The first step to the third step of the method of etching a nitride film are shown in FIGS. 3A to 3C. The detailed operations are the same as described in FIGS. 2A to 2C, except that the relative position of the probe and the silicon substrate 100 is moved (or changed) corresponding a predetermined etching pattern thereby transferring the pattern to the nitride film 120.

After finishing the oxidization process, the oxidized region 140 is formed in the nitride film 120, as shown in FIG. 3C. Then, HF solution is used to carry out a first selectively etching and the oxidized region 140 in the nitride film 120 is removed, thereby obtaining the etching pattern as shown in FIG. 3D.

Figure 3D:
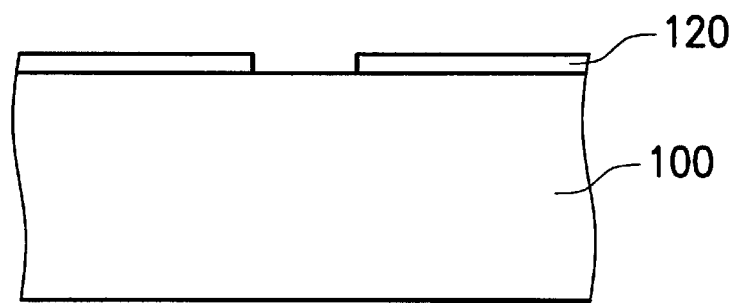
Figure 3D:
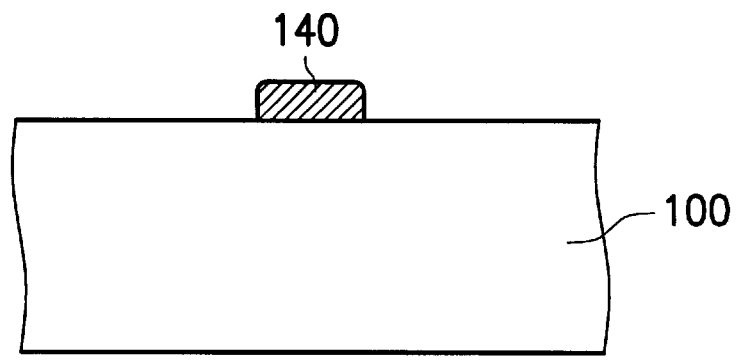

Alternatively, $H_3PO_4$ solution is used to etch the unoxidized region of the nitride film 120, thereby obtaining the inverse tone of the etching pattern as shown in FIG. 3D'.

Figure 3E:
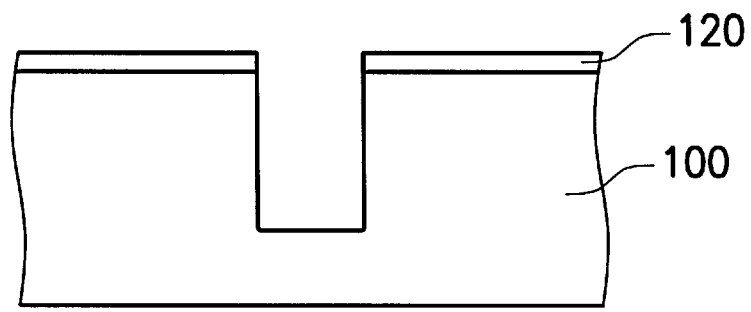
Figure 3E:
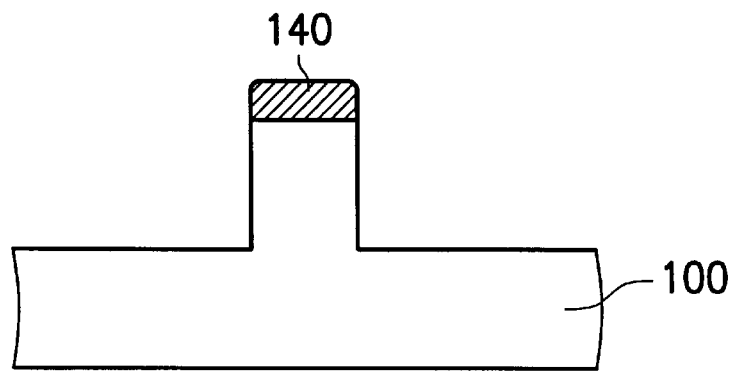

Finally, the pattern formed on the silicon substrate 100 serves as a mask (140 or 120) and a second selectively etching is carried out for etching the silicon substrate 100 revealing out of the mask. In this embodiment, the second selective etching uses the etching solvents, with high etching selectivity, such as KOH, EDP (ethylene diamine pyrocatechol), and TMAH (tetramethyl ammonium hydroxide) to etching the silicon substrate 100 thereby forming the structure with high aspect ratios, as shown in FIG. 3E or FIG. 3E'.

After etching the oxidized region 140 or the unoxidized region of the nitride film 120, at least two kind of surface structures with different chemical property are formed on the silicon substrate 100. In this embodiment, the surface structure is Si—Si3N4, $SiO_2$—Si, or $SiO_xN_y$—Si. Therefore, a growth template can be formed for carrying out chemical selective formation processes by using the method of etching nitride films described above.

In addition, the method of oxidizing nitride films can be performed in the atmosphere and reacts fast, and therefore it can operate in conjunction with the method of etching nitride films for fabricating memory media. FIGS. 4A to 4G show, in cross sectional view, the process of one embodiment of the present invention for fabricating memory media. For brevity, the same elements or devices in FIGS. 4A~4G and FIGS. 2A~2C are represented in the same notations or numerals.

Figure 4A:
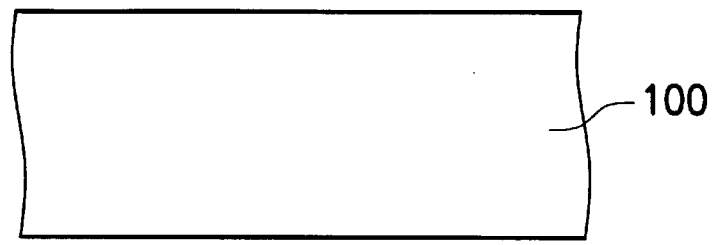
FIGS. 4A to 4G show, in cross sectional view, the process of one embodiment of the present invention for fabricating memory media.
Figure 4B:
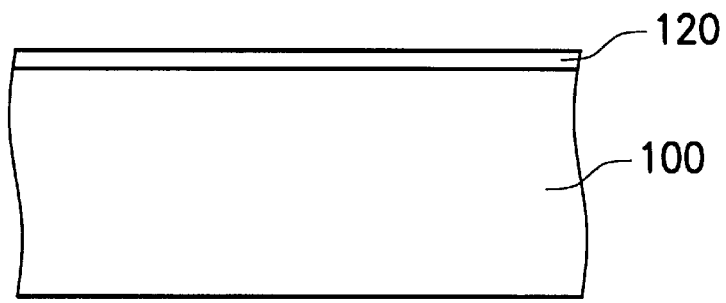
Figure 4C:
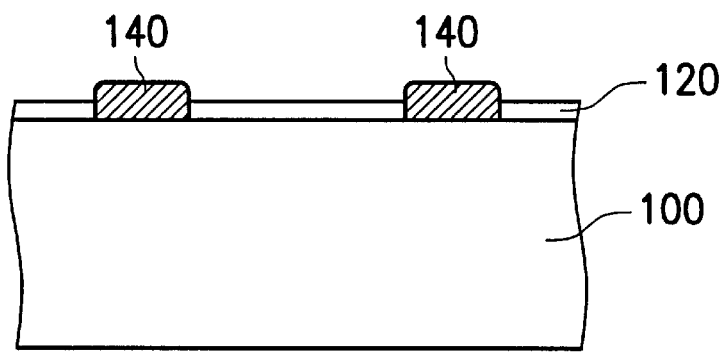

The first step to the third step of the method of fabricating memory media are shown in FIGS. 4A to 4C. The detailed operations are the same as described in FIGS. 2A to 2C, except that the relative position of the probe and the silicon substrate 100 is moved (or changed) corresponding a predetermined arrangement of pattern, thereby transferring the pattern to the nitride film 120.

Figure 4D:
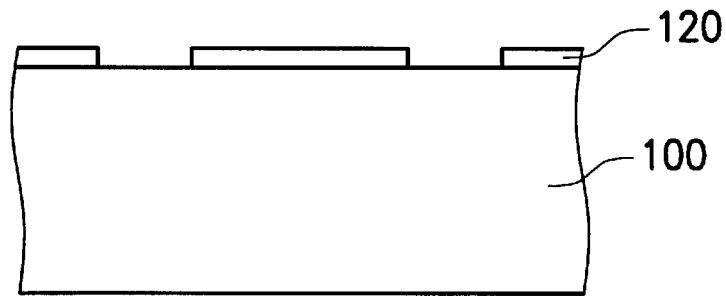

After finishing the oxidization process, the oxidized regions 140 are formed in the nitride film 120, as shown in FIG. 4C. Then, HF solution is used to carry out a first selectively etching and the oxidized regions 140 in the nitride film 120 are removed, thereby obtaining the etching pattern as shown in FIG. 4D.

Figure 4E:
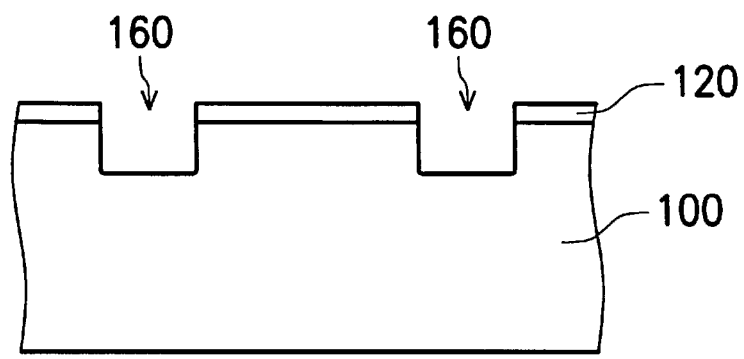

The pattern formed on the silicon substrate 100 serves as a mask (120) and a second selectively etching is carried out for etching the silicon substrate 100 revealing out of the mask. In this embodiment, the second selective etching uses the etching solvents, with high etching selectivity, such as KOH, EDP (ethylene diamine pyrocatechol), and TMAH (tetramethyl ammonium hydroxide) to etching the silicon substrate 100 thereby forming several etching holes 160 deep into the silicon substrate 100, as shown in FIG. 4E. The arrangement of the etching holes 160 represent the recording information in memory media.

Figure 4F:
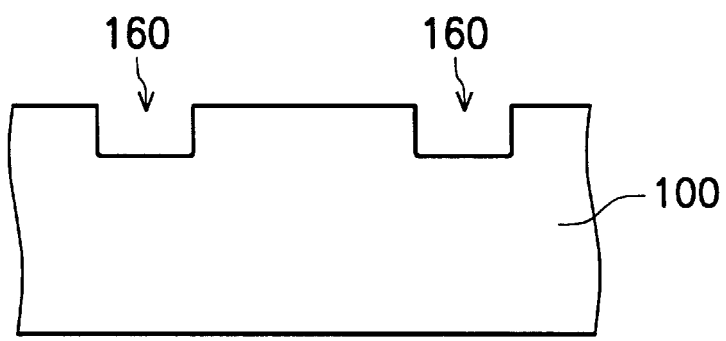
Figure 4G:
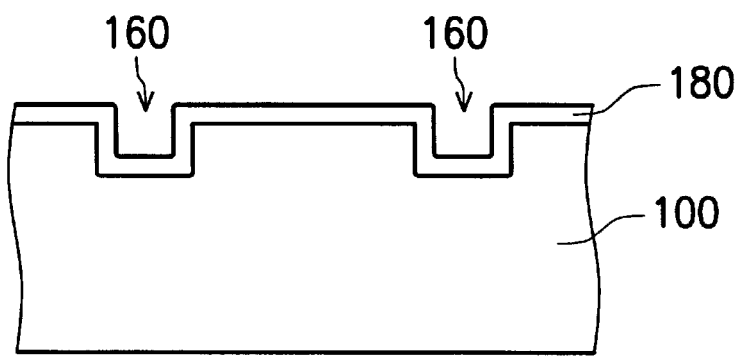

In FIG. 4F, the nitride film 120 (the mask) is removed by using HF solvent.

Finally, a film 180 of high reflectivity is conformally formed on the silicon substrate 100 by using vapor deposition. Due to formation of the film 180, the memory media can be accessed via optical methods.

In above embodiments, the conductive substrate is a p-type silicon substrate, but not limited to the p-type silicon substrate. The conductive substrate is able to be made up from other conductive semiconductors such as Si, GaAs, doped diamond, SiC, SiGe, InP, AlAs, AlGaAs, InGaAs, InAs and ZnSe ,etc. Also, the conductive substrate is able to be made up from metal materials such as Ti, Cr, Al, Cu, Nb, W, In, Ir, Fe, Ni, Co, Mn, Ta, and Sn ,etc.

In addition, the nitride film is selected from a silicon nitride film or a gallium nitride film, formed by using nitridation process or film deposition process.

Further, the probe (the electrode terminal) is a conductive local probe or a conductive probe array, made up of heavily doped semiconductor, metal-gilt heavily doped semiconductor, metal, or carbon nanotube.

To transfer patterns to the nitride film, wet etching methods are carried out to remove the nitride film in the above embodiments. However, the nitride film also can be removed by using selective dry etching methods such as plasma etching, reactive ion etching, and ion milling, etc.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of oxidizing a nitride film on a conductive substrate comprising the steps of:

providing a conductive substrate;

forming a nitride film on the main surface of said conductive substrate;

providing an electrode terminal, and generating an electric field between said electrode terminal and said conductive substrate in an oxidizing environment, wherein said electric field passes through said nitride film, thereby oxidizing said nitride film passed by said electric field.

2. The method as claimed in claim 1, wherein said conductive substrate is made up of Si, GaAs, AlAs, AlGaAs, doped diamond, SiC, SiGe, InP, InGaAs, InAs or ZnSe.

3. The method as claimed in claim 1, wherein said conductive substrate is made up of metal materials such as Ti, Cr, Al, Cu, Nb, W, In, Ir, Fe, Ni, Co, Mn, Ta, and Sn.

4. The method as claimed in claim 1, wherein said nitride film is formed by using nitridation process or film deposition process.

5. The method as claimed in claim 1, wherein said nitride film is selected from a silicon nitride film, or a gallium nitride film.

6. The method as claimed in claim 1, wherein said electrode terminal is a conductive local probe or a conductive probe array, made up of heavily doped semiconductor, metal-gilt heavily doped semiconductor, metal, or carbon nanotube.

7. A method of defining patters on a nitride film comprising the steps of:
   providing a conductive substrate;
   forming a nitride film on the main surface of said conducive substrate;
   providing an electrode terminal, and generating an electric field between said electrode terminal and said conductive substrate for passing through said nitride film;
   moving the relative positions of said electrode terminal and said conductive substrate corresponding to a specific pattern, thereby oxidizing one portion of said nitride film and transferring said specific pattern to said nitride film.

8. The method as claimed in claim 7, further comprising the step of removing the oxidized portion of said nitride film to revealing said conductive substrate.

9. The method as claimed in claim 8, further comprising the step of removing the portion of said conductive substrate revealing out of the remaining portion of said nitride film.

10. The method as claimed in claim 9, wherein said revealing portion of said conductive substrate is removed by using selective etching solution.

11. The method as claimed in claim 9, wherein said revealing portion of said conductive substrate is removed by using selective dry etching methods such as plasma etching, reactive ion etching, and ion milling.

12. The method as claimed in claim 10, wherein said selective etching solvent is made up of KOH, EDP (ethylene diamine pyrocatechol), or TMAH (tetramethyl ammonium hydroxide).

13. The method as claimed in claim 7, wherein said conductive substrate is made up of Si, GaAs, AlAs, AlGaAs, doped diamond, SiC, SiGe, InP, InGaAs, InAs or ZnSe.

14. The method as claimed in claim 7, wherein said conductive substrate is made up of metal materials such as Ti, Cr, Al, Cu, Nb, W, In, Ir, Fe, Ni, Co, Mn, Ta, and Sn.

15. The method as claimed in claim 7, wherein said nitride film is formed by using nitridation process or film deposition process.

16. The method as claimed in claim 7, wherein said nitride film is selected from a silicon nitride film or a gallium nitride film.

17. The method as claimed in claim 7, wherein said electrode terminal is a conductive local probe or a conductive probe array, made up of heavily doped semiconductor, metal-gilt heavily doped: semiconductor, metal, or carbon nanotube.

18. The method as claimed in claim 8, wherein the oxidized portion of said nitride film is removed by using selective etching solution.

19. The method as claimed in claim 8, wherein the oxidized portion of said nitride film is removed by using selective dry etching methods such as plasma etching, reactive ion etching, and ion milling.

20. The method as claimed in claim 18, wherein said selective etching solvent is made up of HF.

21. The method as claimed in claim 7, further comprising the step of removing the unoxidized portion of said nitride film by using selective etching solution to revealing said conductive substrate.

22. The method as claimed in claim 7, further comprising the step of removing the unoxidized portion of said nitride film by using selective dry etching methods such as plasma etching, reactive ion etching, and ion milling to revealing said conductive substrate.

23. The method as claimed in claim 21, wherein said selective etching solvent is made up of $H_3PO_4$.

24. A method of fabricating memory media, the memory media using the arrangement of a plurality of etching holes formed on a conductive substrate for recording information, the method comprising the steps of:
   providing an electrode terminal;
   forming a nitride film on the main surface of said conductive substrate;
   generating an electric field between said electrode terminal and said conductive substrate, wherein said electric field passes through said nitride film;
   moving the relative positions of said electrode terminal and said conductive substrate corresponding to a predetermined arrangement of etching holes, thereby forming a plurality of oxidizing regions on said nitride film;
   removing said oxidizing regions in said nitride film to form a plurality of etching holes in said nitride film, deep into said conductive substrate, for recording information;
   removing the remaining nitride film;
   conformally forming a film with high reflectivity on said conductive substrate.

25. The method as claimed in claim 24, wherein said conductive substrate is made up of Si, GaAs, AlAs, AlGaAs, doped diamond, SiC, SiGe, InP, InGaAs, InAs or ZnSe.

26. The method as claimed in claim 24, wherein said conductive substrate is made up of metal materials such as Ti, Cr, Al, Cu, Nb, W, In, Ir, Fe, Ni, Co, Mn, Ta, and Sn.

27. The method as claimed in claim 24, wherein said nitride film is formed by using nitridation process or film deposition process.

28. The method as claimed in claim 24, wherein said nitride film is selected from a silicon nitride film or a gallium nitride film.

29. The method as claimed in claim 1, wherein said electrode terminal is a conductive local probe or a conductive probe array, made up of heavily doped semiconductor, metal-gilt heavily doped semiconductor, metal, or carbon nanotube.

30. A method of performing chemical selective formation processes on a conductive substrate comprising the steps of:
   providing a conductive substrate;
   forming a nitride film on the main surface of said conductive substrate;
   providing an electrode terminal, and generating an electric field between said electrode terminal and said conductive substrate, wherein said electric field passes through said nitride film, thereby oxidizing said nitride film passed by said electric field;
   selectively removing the oxidized portion of said nitride film or the unoxidized portion of said nitride filed film;
   carrying out chemical selective formation processes.

31. The method as claimed in claim 30, further comprising the step of etching said conductive substrate revealing out of said nitride film, before carrying out the chemical selective formation processes.

32. The method as claimed in claim 31, wherein said conductive substrate is etching by using selective dry etching methods such as plasma etching, reactive ion etching, and ion milling.

33. The method as claimed in claim 31, wherein said conductive substrate is etching by using selective etching solution.

34. The method as claimed in claim 33, wherein said selective etching solvent is made up of KOH, EDP (ethylene diamine pyrocatechol), or TMAH (tetramethyl ammonium hydroxide).

35. The method as claimed in claim 30, wherein said conductive substrate is made up of Si, GaAs, AlAs, AlGaAs, doped diamond, SiC, SiGe, InP, InGaAs, InAs or ZnSe.

36. The method as claimed in claim 30, wherein said conductive substrate is made up of metal materials such as Ti, Cr, Al, Cu, Nb, W, In, Ir, Fe, Ni, Co, Mn, Ta, and Sn.

37. The method as claimed in claim 30, wherein said nitride film is formed by using nitridation process or film deposition process.

38. The method as claimed in claim 30, wherein said nitride film is selected from a silicon nitride film or a gallium nitride film.

39. The method as claimed in claim 30, wherein said electrode terminal is a conductive local probe or a conductive probe array, made up of heavily doped semiconductor, metal-gilt heavily doped semiconductor, metal, or carbon nanotube.

40. The method as claimed in claim 30, wherein the oxidized portion of said nitride film is removed by using selective etching solution, but the unoxidized portion of said nitride film is not removed.

41. The method as claimed in claim 30, wherein the oxidized portion of said nitride film is removed by using selective dry etching methods such as plasma etching, reactive ion etching, and ion milling, but the unoxidized portion of said nitride film is not removed.

42. The method as claimed in claim 40, wherein said selective etching solvent is made up of HF.

43. The method as claimed in claim 30, wherein the unoxidized portion of said nitride film is removed by using selective etching solution, but the oxidized portion of said nitride film is not removed.

44. The method as claimed in claim 30, wherein the unoxidized portion of said nitride film is removed by using selective dry etching methods such as plasma etching, reactive ion etching, and ion milling, but the oxidized portion of said nitride film is not removed.

45. The method as claimed in claim 43, wherein said selective etching solvent is made up of $H_3PO_4$.

* * * * *